(12) United States Patent
Kurimoto

(10) Patent No.: US 10,012,700 B2
(45) Date of Patent: Jul. 3, 2018

(54) ELECTRIC STORAGE APPARATUS

(75) Inventor: Yasuhide Kurimoto, Kasugai (JP)

(73) Assignee: Toyota Jidosha Kabushiki Kaisha, Toyota-shi, Aichi (JP)

( * ) Notice: Subject to any disclaimer, the term of this patent is extended or adjusted under 35 U.S.C. 154(b) by 280 days.

(21) Appl. No.: 13/816,817

(22) PCT Filed: Oct. 13, 2011

(86) PCT No.: PCT/JP2011/005737
§ 371 (c)(1),
(2), (4) Date: Feb. 13, 2013

(87) PCT Pub. No.: WO2012/049852
PCT Pub. Date: Apr. 19, 2012

(65) Prior Publication Data
US 2013/0200902 A1    Aug. 8, 2013

(30) Foreign Application Priority Data

Oct. 14, 2010   (JP) ................... 2010-231965

(51) Int. Cl.
*G01N 27/416* (2006.01)
*H02J 7/00* (2006.01)
(Continued)

(52) U.S. Cl.
CPC ........ *G01R 31/3627* (2013.01); *B60L 3/0046* (2013.01); *B60L 3/12* (2013.01); *B60L 11/1857* (2013.01); *B60L 11/1864* (2013.01); *G01R 31/3662* (2013.01); *H01M 2/1077* (2013.01); *H01M 10/48* (2013.01); *B60L 2240/54* (2013.01); *B60L 2240/545* (2013.01); *B60L 2240/547* (2013.01); *B60L 2240/549* (2013.01);
(Continued)

(58) Field of Classification Search
CPC ................................. G01R 31/3662
USPC ........................ 324/430; 320/122
See application file for complete search history.

(56) References Cited

U.S. PATENT DOCUMENTS

2001/0035737 A1* 11/2001 Nakanishi .......... G01R 31/3624
                                                          320/122
2006/0186890 A1*  8/2006 Iwane et al. ................ 324/426
(Continued)

FOREIGN PATENT DOCUMENTS

CA      2 448 277      12/2002
JP      7-282830       10/1995
(Continued)

*Primary Examiner* — Edward Tso
*Assistant Examiner* — Ahmed Omar
(74) *Attorney, Agent, or Firm* — Finnegan, Henderson, Farabow, Garrett & Dunner LLP

(57) ABSTRACT

A diagnosis apparatus performing a diagnosis for reuse of an electric storage apparatus including a plurality of electric storage elements connected electrically in series includes a voltage sensor detecting a voltage of each of a plurality of blocks, the plurality of electric storage elements being divided into the blocks; a current sensor detecting a current in the electric storage apparatus; and a controller calculating an internal resistance of each of the blocks based on outputs from the voltage sensor and the current sensor. The controller specifies the highest of the internal resistances of the plurality of blocks as a criterion to perform the diagnosis for the reuse of the electric storage apparatus.

9 Claims, 10 Drawing Sheets

(51) Int. Cl.

| | | |
|---|---|---|
| *G01R 31/36* | (2006.01) | |
| *H01M 10/48* | (2006.01) | |
| *H01M 2/10* | (2006.01) | |
| *B60L 3/00* | (2006.01) | |
| *B60L 3/12* | (2006.01) | |
| *B60L 11/18* | (2006.01) | |
| *H01M 10/44* | (2006.01) | |

(52) U.S. Cl.
CPC ....... *B60L 2240/70* (2013.01); *B60L 2240/80* (2013.01); *B60L 2260/44* (2013.01); *G01R 31/3658* (2013.01); *H01M 10/441* (2013.01); *H01M 2220/20* (2013.01); *H02J 7/0021* (2013.01); *Y02T 10/7005* (2013.01); *Y02T 10/7055* (2013.01); *Y02T 10/7061* (2013.01); *Y02T 10/7291* (2013.01); *Y02T 90/16* (2013.01)

(56) References Cited

U.S. PATENT DOCUMENTS

| | | | |
|---|---|---|---|
| 2007/0108946 A1 | 5/2007 | Yamauchi et al. | |
| 2010/0004885 A1* | 1/2010 | Nakanishi | 702/63 |
| 2010/0036628 A1* | 2/2010 | Plestid | 702/63 |
| 2010/0047684 A1 | 2/2010 | Okumura et al. | |
| 2010/0052617 A1* | 3/2010 | Aridome | B60L 3/0046 320/132 |
| 2010/0151321 A1* | 6/2010 | Yamamoto et al. | 429/218.1 |
| 2010/0194398 A1* | 8/2010 | Kawasumi et al. | 324/430 |
| 2011/0089907 A1* | 4/2011 | Bhardwaj | G01R 31/3662 320/136 |
| 2011/0295533 A1 | 12/2011 | Porcellato | |

FOREIGN PATENT DOCUMENTS

| | | |
|---|---|---|
| JP | 2002-15781 | 1/2002 |
| JP | 2003-17142 | 1/2003 |
| JP | 2003-240609 | 8/2003 |
| JP | 2003-244860 | 8/2003 |
| JP | 2007-141464 | 6/2007 |
| JP | 2008-153150 | 7/2008 |
| JP | 2008-193715 | 8/2008 |
| JP | 2008-293703 | 12/2008 |
| JP | 2009-128250 | 6/2009 |
| WO | WO 2010/092275 | 8/2010 |

* cited by examiner

FIG. 3

| INTERNAL RESISTANCE (HIGHEST VALUE) | DATE AND TIME | RUNNING DISTANCE [km] |
|---|---|---|
| R11 | 2010.12.01 | 2955 |
| R12 | 2010.09.01 | 2805 |
| R13 | 2010.06.01 | 2699 |
| R14 | 2010.03.01 | 2586 |
| R21 | 2009.03.01 | 2123 |
| R22 | 2008.03.01 | 1786 |
| R23 | 2007.03.01 | 1213 |
| R24 | 2006.03.01 | 760 |
| R25 | 2005.03.01 | 320 |
| ... | ... | ... |

↑ NEWER

↑ OLDER

ELECTRIC STORAGE APPARATUS

CROSS-REFERENCE TO RELATED APPLICATIONS

This application is a national phase application of International Application No. PCT/JP2011/005737, filed Oct. 13, 2011, and claims the priority of Japanese Application No. 2010-231965, filed Oct. 14, 2010, the content of both of which is incorporated herein by reference.

TECHNICAL FIELD

The present invention relates to a diagnosis apparatus capable of performing a diagnosis for reuse of an electric storage apparatus, and to the electric storage apparatus to be reused.

BACKGROUND ART

An assembled battery (secondary battery) is used as the power source for an electronic device. For example, the assembled battery is used as the power source for running of a vehicle.

When the assembled battery reaches the end of its life, the assembled battery needs replacement. It can be determined whether or not the assembled battery reaches the end of its life by detecting the voltage, current, or temperature of the assembled battery to estimate the deterioration state of the assembled battery.

PRIOR ART DOCUMENTS

Patent Documents

[Patent Document 1] Japanese Patent Laid-Open No. 2003-244860
[Patent Document 2] Japanese Patent Laid-Open No. 2003-240609
[Patent Document 3] Japanese Patent Laid-Open No. 2003-017142
[Patent Document 4] Japanese Patent Laid-Open No. 2008-193715
[Patent Document 5] Japanese Patent Laid-Open No. 07-282830
[Patent Document 6] Japanese Patent Laid-Open No. 2009-128250

SUMMARY OF THE INVENTION

Problems to be Solved by the Invention

When the assembled battery reaches the end of its life, the assembled battery needs replacement. When the assembled battery has not reached the end of its life, however, the assembled battery can continue to be used. For example, when an assembled battery mounted on a vehicle is removed and the removed assembled battery has not reached the end of its life, the assembled battery can be mounted on another vehicle. In other words, the assembled battery can be reused.

The present invention proposes a criterion to perform a diagnosis for reuse of an electric storage apparatus, and it is an object of the present invention to prevent an erroneous diagnosis for reuse of the electric storage apparatus.

Means for Solving the Problems

According to a first aspect, the present invention provides a diagnosis apparatus performing a diagnosis for reuse of an electric storage apparatus including a plurality of electric storage elements connected electrically in series, including a voltage sensor detecting a voltage of each of a plurality of blocks, the plurality of electric storage elements being divided into the blocks; a current sensor detecting a current in the electric storage apparatus; and a controller calculating an internal resistance of each of the blocks based on an output from the voltage sensor and an output from the current sensor. The controller specifies the highest of the internal resistances of the plurality of blocks as a criterion to perform the diagnosis for the reuse of the electric storage apparatus.

The internal resistance of each block calculated by the controller includes not only the internal resistance of the entire block but also the internal resistance of each of the electric storage elements included in each block when each block includes the plurality of electric storage elements. Since the internal resistance of each electric storage element has a value for each block, the internal resistance can be used as the criterion to perform the diagnosis for the reuse of the electric storage apparatus.

The diagnosis for the reuse of the electric storage apparatus includes determining whether or not the electric storage apparatus can be reused and estimating a time period of the reuse when the electric storage apparatus can be reused. Each of the blocks can be formed of the plurality of electric storage elements. Alternatively, each of the blocks can be formed of each electric storage element. The electric storage apparatus can be mounted on a vehicle and output an energy for use in running of the vehicle. Since the internal resistance is used as the criterion to perform the diagnosis for the reuse of the electric storage apparatus in the present invention, the electric storage apparatus determined as reusable can be preferably used in a system requiring a momentary output.

According to a second aspect, the present invention provides a method of performing a diagnosis for reuse of an electric storage apparatus including a plurality of electric storage elements connected electrically in series, including the steps of calculating an internal resistance of each of a plurality of blocks based on a voltage of each of the blocks and a current in the electric storage apparatus, the plurality of electric storage elements being divided into the blocks; and specifying the highest of the internal resistances of the plurality of blocks as a criterion to perform the diagnosis for the reuse of the electric storage apparatus.

It can be determined whether or not the electric storage apparatus can be reused by comparing the highest internal resistance with a threshold value indicating a boundary of whether or not the electric storage apparatus can be reused.

A third aspect of the present invention includes a plurality of electric storage elements connected electrically in series. When the plurality of electric storage elements are divided into a plurality of blocks, a first block is replaced by using the electric storage element to be reused for a second block. The first block has a resistance increase rate lower than a resistance increase rate of the second block in replacing the first block. This applies to the case when the resistance increase rate is changed to the absolute value of resistance.

In replacing the first block, the resistance increase rate of the first block is set to be lower than the resistance increase rate of the second block, which can prevent deterioration of the first block earlier than that of the second block to avoid an increase in the frequency of replacement of the first block. The resistance increase rates of the first block and the second block can be calculated before the first block is replaced.

The number of the first blocks can be smaller than the number of the second blocks. When the number of the first blocks is larger than the number of the second blocks, replacement of the entire electric storage apparatus is preferable to replacement of the first block.

When the plurality of second blocks are present, the first block can have the resistance increase rate lower than the lowest of the resistance increase rates of the plurality of second blocks. This can prevent deterioration of the first block earlier than that of all the second blocks to avoid an increase in the frequency of replacement of the first block.

The resistance increase rate of the first block can be associated with a use history of the electric storage apparatus before the first block is replaced. Thus, the first block having the resistance increase rate associated with the use history can be used in the replacement of the first block. The first block including the electric storage element to be reused has the resistance increase rate which varies depending on the deterioration state of the electric storage element to be reused. The use of the first block having the resistance increase rate associated with the use history enables the use of a plurality of first blocks having different resistance increase rates without waste.

A history of a parameter contributing to the deterioration of the electric storage element can be used as the use history. Through the use of the history of the parameter contributing to the deterioration of the electric storage element, the deterioration state of the electric storage element after the replacement of the first block can be assumed, and the first block can be selected on the basis of that deterioration state. Examples of the use history include the frequency of occurrence of each SOC of the electric storage apparatus, the frequency of occurrence of each temperature of the electric storage apparatus, or the totalized time of each SOC when the SOC of the electric storage apparatus is maintained.

Each of the blocks can be formed of a plurality of electric storage elements or each electric storage element. The plurality of electric storage elements can be mounted on a vehicle and output an energy for use in running of the vehicle.

Advantage of the Invention

According to the present invention, since the diagnosis for the reuse of the electric storage apparatus is performed on the basis of the internal resistance, the electric storage apparatus can be reused with the input/output characteristics of the electric storage apparatus obtained. Since the highest of the internal resistances of the plurality of blocks is used, an erroneous diagnosis for the reuse of the electric storage apparatus can be avoided.

BRIEF DESCRIPTION OF THE DRAWINGS

FIG. 3 is a diagram showing information stored in a memory in Embodiment 1.

EMBODIMENT OF THE INVENTION

Embodiments of the present invention will hereinafter be described.

Embodiment 1

A battery system which is Embodiment 1 of the present invention is described with reference to FIG. 1.

An assembled battery (which corresponds to an electric storage apparatus) 10 has a plurality of cells (which corresponds to electric storage elements) 11 connected electrically in series. A secondary battery such as a nickel metal hydride battery or a lithium-ion battery can be used as the cell 11. In the nickel metal hydride battery, a negative electrode is typically made of AB5-type alloy, and as the battery is used over time, pulverization and elution of a B layer have an influence on an A layer serving as a catalyst to result in the A(Ni)-rich alloy to promote activation. This causes a phenomenon in which the resistance of a positive electrode rises and the resistance of the negative electrode drops. Since the embodiment of the present invention focuses on the resistance of the battery, the lithium-ion battery can be used preferably as the cell 11. An electric double layer capacitor may be used instead of the secondary battery. The number of the cells 11 can be set as appropriate based on the required output of the assembled battery 10 or the like.

The plurality of cells 11 constituting the assembled battery 10 is divided into a plurality of battery blocks 12. Each of the battery blocks 12 is formed of a plurality of cells 11 connected electrically in series, and the all of the battery blocks 12 include an equal number of cells 11. The equal number of the cells 11 included in all the battery blocks 12 facilitates the comparison of internal resistances between the plurality of battery blocks 12, as later described.

Figure 1:
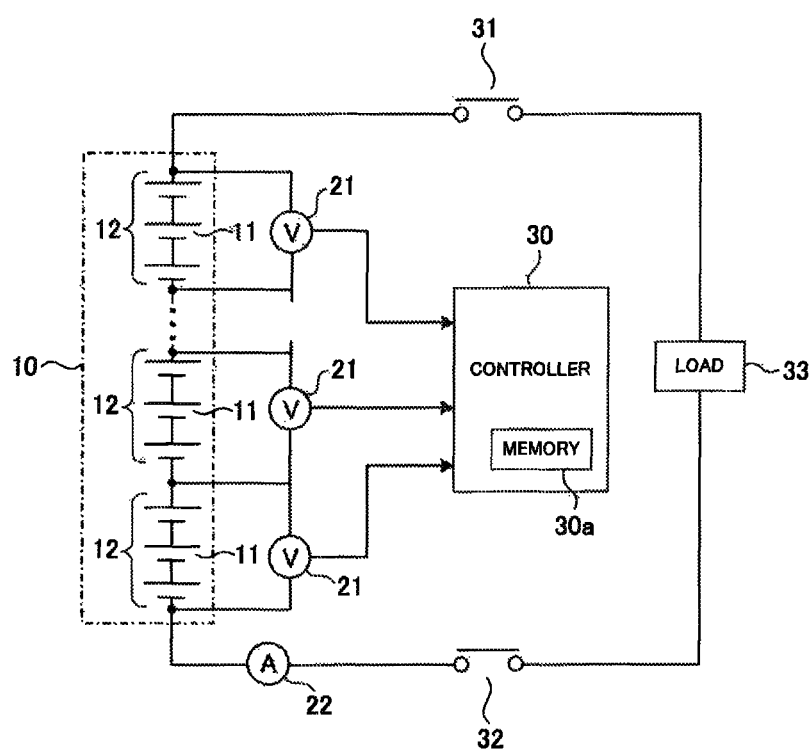
FIG. 1 is a diagram showing a battery system according to Embodiment 1.

While FIG. 1 shows that the single battery block 12 consists of three cells 11, the number of the cells 11 constituting the battery block 12 can be set as appropriate. Alternatively, the numbers of the cells 11 included in the battery blocks 12 may vary among the battery blocks 12.

A voltage sensor 21 is provided for each of the battery blocks 12 and detects a voltage across terminals of each battery block 12. The detection information of the voltage sensor 21 is output to a controller 30. The controller 30 monitors the voltage of each battery block 12. A current sensor 22 detects a current in the assembled battery 10 and outputs the detection information to the controller 30. The controller 30 monitors the current in the assembled battery 10 based on the output from the current sensor 22.

The assembled battery 10 is connected to a load 33 through relays 31 and 32. When the relays 31 and 32 are ON, the power of the assembled battery 10 is supplied to the load 33. The controller 30 controls ON/OFF of each of the relays 31 and 32. While the controller 30 contains a memory 30*a* in the present embodiment, the memory 30*a* may be provided outside the controller 30. The memory 30*a* can have various types of information stored therein such as control parameters for use in controlling charge and discharge of the assembled battery 10.

When the assembled battery 10 is mounted on a vehicle, a motor generator can be used as the load 33. Examples of the vehicle having the assembled battery 10 mounted thereon include a hybrid vehicle and an electric vehicle. The hybrid vehicle includes not only the assembled battery 10 but also another power source such as a fuel cell and an internal-combustion engine as the power source for running the vehicle. The electric vehicle employs only the assembled battery 10 as the power source for the vehicle.

The motor generator can receive the power from the assembled battery 10 to generate a kinetic energy for running the vehicle. For decelerating or stopping the vehicle, the motor generator can convert a kinetic energy produced in braking the vehicle into an electric energy and supply the electric energy to the assembled battery 10.

A DC/DC converter or an inverter can be placed on a current path between the motor generator and the assembled battery 10. When the DC/DC converter is used, the voltage output from the assembled battery 10 can be increased and then supplied to the motor generator, and the voltage from the motor generator can be reduced and then supplied to the assembled battery 10. When the inverter is used, an AC motor can be used as the motor generator.

Figure 2:
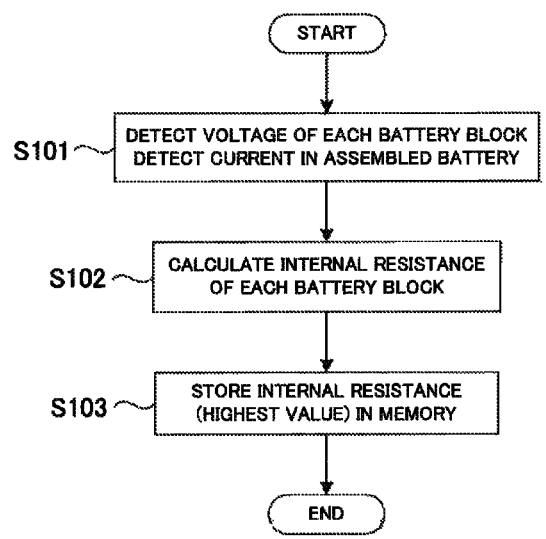
FIG. 2 is a flow chart showing processing of determining deterioration of an assembled battery in Embodiment 1.

Next, processing of diagnosing the deterioration state of the assembled battery 10 is described with reference to a flow chart shown in FIG. 2. The processing shown in FIG. 2 is performed by the controller 30.

The deterioration of the battery includes a component due to the material itself of the battery, a component due to charge and discharge at a high rate, and a component due to precipitation of lithium. The deterioration of the battery can be typically recognized on the basis of an increase in resistance value and a reduction in capacity. The deterioration components contribute to the increase in resistance value and the reduction in capacity at different rates, so that they should be treated as different indices.

The deterioration refers to a state in which the cell 11 has lower input/output characteristics, and can be represented by the internal resistance of the cell 11. As the internal resistance is increased, it can be determined that the cell 11 is more deteriorated.

At step S101, the controller 30 acquires the value of a voltage of each battery block 12 based on the output from each voltage sensor 21. The controller 30 also acquires the value of a current in the assembled battery 10 based on the output from the current sensor 22.

At step S102, the controller 30 calculates the internal resistance of each battery block 12 based on the information (voltage value and current value) acquired at step S101. At step S103, the controller 30 stores the internal resistance having the highest value of the internal resistances of the plurality of battery blocks 12 in the memory 30*a*.

Since all of the battery blocks 12 include the equal number of the cells 11 in the present embodiment, the internal resistance having the highest value can be specified only by calculating the internal resistance of each battery block 12 and comparing the calculated internal resistances.

If the numbers of the cells 11 included in the battery blocks 12 vary among the battery blocks 12, the internal resistance having the highest value can be specified by calculating the internal resistance of the cell 11 included in each battery block 12 and comparing the calculated internal resistances. Specifically, the value of a voltage of each battery block 12 (the output from the voltage sensor 21) is divided by the number of the cells 11 included in the battery block 12 to calculate the value of the voltage of each cell 11, and then the internal resistance of each cell 11 can be calculated on the basis of the voltage value of the cell 11 and the current value acquired from the output of the current sensor 22. The internal resistance of the cell 11 has a value for the associated battery block 12.

The processing shown in FIG. 2 can be performed each time a predetermined condition is satisfied. Specifically, each time a timer counts a predetermined time period, the internal resistance of each battery block 12 can be calculated, and the internal resistance (highest value) can be stored in the memory 30*a*. When the assembled battery 10 is mounted on the vehicle, each time the running distance of the vehicle reaches a predetermined distance, the internal resistance of each battery block 12 can be calculated, and the internal resistance (highest value) can be stored in the memory 30*a*.

Since the plurality of internal resistances (highest values) are stored in the memory 30*a* in this case, the memory 30*a* needs to have a certain available space. Alternatively, the pieces of data indicating the internal resistances (highest values) stored in the memory 30*a* may be thinned out. The thinning-out of the pieces of data can eliminate the need to have a large capacity in the memory 30*a*.

For example, the processing shown in FIG. 2 can be performed once in three months, and in this case, four pieces of data indicating internal resistances (highest values) are stored in the memory 30*a* in one year. Each time one year has elapsed, three of the four pieces acquired in that year can be deleted with the remaining one piece maintained. Thus, four pieces of data are stored in the memory 30*a* for the period corresponding to the past year, and one piece of data is stored in the memory 30*a* for each year of the period up to one year ago. FIG. 3 shows an example of information stored in the memory 30*a* according to the method described above.

The timings of acquiring the data indicating the internal resistance (highest value), that is, the number of times the data indicating the internal resistance (highest value) is acquired within a predetermined period, can be set as appropriate. The method of thinning out the internal resistances (highest values) can also be set as appropriate. Preferably, the data indicating the internal resistance (highest value) last acquired is not removed but maintained. This allows the latest state of the assembled battery 10 to be checked.

The internal resistance (highest value) is used as the information indicating the deterioration state of the assembled battery 10 in the present embodiment. It can be determined on the basis of the internal resistance (highest value) whether or not the assembled battery 10 should be replaced. Specifically, when the internal resistance (highest value) reaches a preset threshold value, the controller 30 determines that charge and discharge of the assembled battery 10 should be inhibited or suppressed to replace the assembled battery 10.

For suppressing the charge and discharge of the assembled battery 10, a threshold value used in controlling the charge and discharge can be changed to reduce, for example. Examples of the threshold value include the upper limit value of the voltage and the upper limit value of the input/output (electric power).

When the internal resistance (highest value) does not reach the threshold value, the assembled battery 10 can be reused. For example, when the assembled battery 10 is removed from the vehicle and the internal resistance (highest value) of the assembled battery 10 does not reach the threshold value, this assembled battery 10 can be mounted on another vehicle. In other words, the assembled battery 10 can be reused. The internal resistance (highest value) serves as a criterion to determine whether or not the assembled battery 10 can be reused.

While the voltage of the battery block 12 is detected in the present embodiment, the present invention is not limited thereto, and the voltage of each of the cells 11 may be detected. Then, the internal resistance of each cell 11 can be calculated on the basis of the voltage value of each cell 11 and the current value in the assembled battery 10, and the internal resistance having the highest value can be used as the information indicating the deterioration state of the assembled battery 10.

Figure 4:
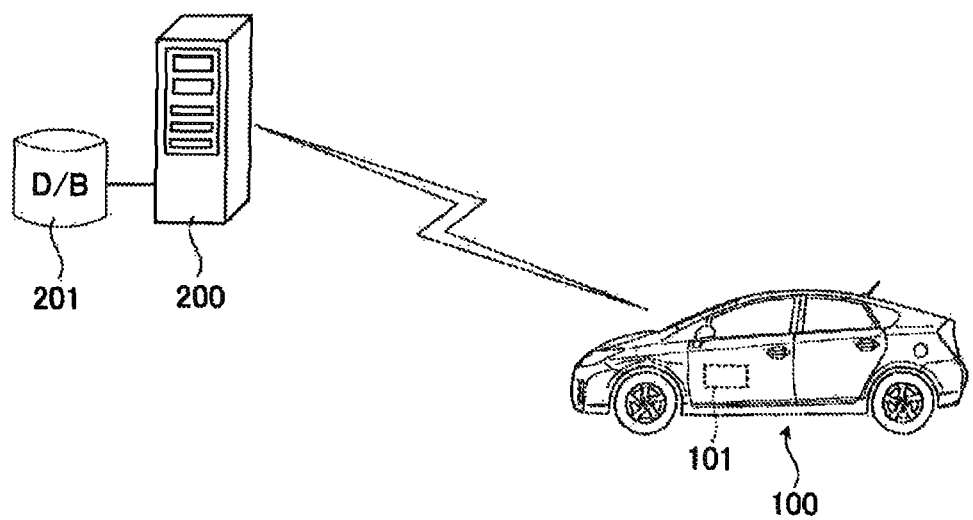
FIG. 4 is a diagram showing a system of managing information about internal resistances (highest values) in Embodiment 1.

Next, description is made of a system used in reusing the assembled battery 10 mounted on the vehicle with reference to FIG. 4.

The controller 30 mounted on a vehicle 100 transmits the information about the internal resistance (highest value) stored in the memory 30a to a server 200. The vehicle 100 has a radio communication device 101 which can transmit the information about the internal resistance (highest value) to the server 200. The information about the internal resistance (highest value) is information for specifying the internal resistance (highest value) and may be information directly representing the internal resistance (highest value) or may be information indirectly representing the internal resistance (highest value).

The controller 30 transmits not only the information about the internal resistance (highest value) but also identifying information of the assembled battery 10 mounted on the vehicle 100 to the server 200. The information received by the server 200 is stored in a database 201. The identifying information of the assembled battery 10 and the information about the internal resistance (highest value) are stored in correspondence with each other in the database 201.

The information stored in the database 201 is not limited to the information about the internal resistance (highest value) and the identifying information. For example, identifying information of the vehicle 100 having the assembled battery 10 mounted thereon, information about the cells 11 constituting the assembled battery 10, and identifying information of an electronic device used together with the assembled battery 10 can be stored in correspondence with the identifying information of the assembled battery 10.

The timing of transmitting the information to the server 200 can be set as appropriate. For example, the controller 30 can transmit the information about the internal resistance (highest value) and the identifying information of the assembled battery 10 to the server 200 each time a predetermined time has elapsed. In this case, the information about the elapsed time can also be transmitted to the server 200, and the information about the elapsed time is stored in the database 201 in correspondence with the identifying information of the assembled battery 10.

The controller 30 can transmit the information about the internal resistance (highest value) and the identifying information of the assembled battery 10 each time the running distance of the vehicle 100 reaches a predetermined distance. In this case, the information about the running distance can also be transmitted to the server 200, and the information about the running distance is stored in the database 201 in correspondence with the identifying information of the assembled battery 10.

When the information about the internal resistance (highest value) or the like is transmitted to the server 200 a plurality of times, the database 201 has the information about the internal resistance (highest value) or the like stored therein accumulatively. Thus, the information stored in the database 201 can be used to check changes in the internal resistance (highest value) in the specific assembled battery 10.

Once the assembled battery 10 is retrieved from the vehicle 100, the changes in the internal resistance (highest value) of the retrieved assembled battery 10 can be checked by accessing the database 201. The changes in the internal resistance (highest value) of the retrieved assembled battery 10 can be seen by checking the data stored in the memory 30a.

It can be determined whether or not the assembled battery 10 can be reused, or the period in which the assembled battery 10 can be reused can be estimated, on the basis of the internal resistance (highest value). For example, when the internal resistance (highest value) reaches the threshold value, it can be determined that the assembled battery 10 can not be reused. The threshold value corresponds to the internal resistance found when the assembled battery 10 reaches the end of its life, and can be set previously.

When the internal resistance (highest value) does not reach the threshold value, the period in which the assembled battery 10 can be reused can be estimated on the basis of the change rate of the internal resistance (highest value). Specifically, as the change rate of the internal resistance (highest value) is increased, it can be estimated that the period in which the assembled battery 10 can be reused (estimated period) is shortened. For example, a map representing the correspondence between the change rate of the internal resistance (highest value) and the period in which the assembled battery 10 can be reused (estimated period) can be provided previously, and the estimated period can be specified with the map. Alternatively, the estimated period can be calculated by inputting the change rage of the internal resistance (highest value) into a predetermined calculation expression.

Figure 5:
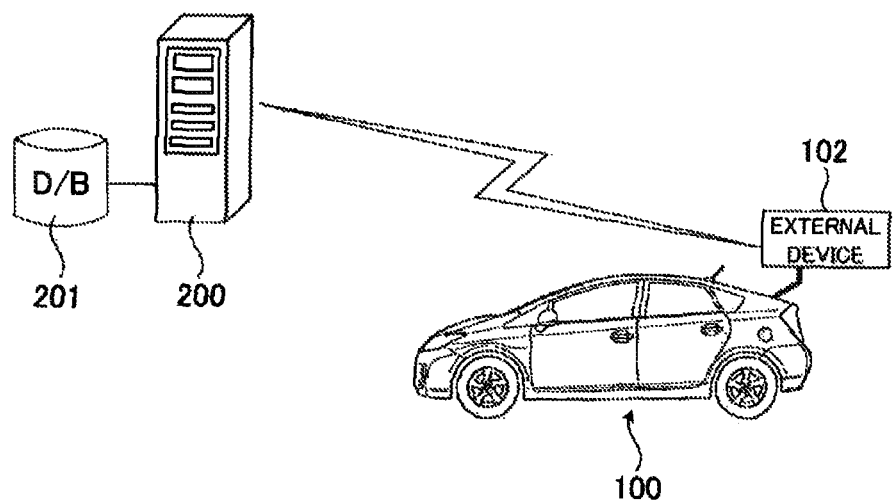
FIG. 5 is a diagram showing a system of managing information about internal resistances (highest values) in a modification of Embodiment 1.

While the controller 30 mounted on the vehicle 100 calculates the internal resistance (highest value) and transmits the data indicating the internal resistance (highest value) from the radio communication device 101 to the server 200 in the present embodiment, the present invention is not limited thereto. For example, an external device 102 can be used to calculate the internal resistance (highest value) as shown in FIG. 5.

Specifically, the information acquired by the voltage sensor 21 and the current sensor 22 is transmitted to the external device 102 which in turn can calculate the internal resistance of each battery block 12 and specify the internal resistance (highest value). The information about the internal resistance (highest value) can be transmitted to the server 200 on a wired or wireless basis. The information about the internal resistance (highest value) can be transmitted directly from the external device 102 to the server 200. Alternatively, the information about the internal resistance (highest value)

can be input to a PC (Personal Computer) and the input data can be transmitted to the server 200 over the Internet. The information received by the server 200 is stored in the database 201.

As described in the present embodiment, the identifying information of the assembled battery 10 can be transmitted to the server 200 in addition to the information about the internal resistance (highest value). In addition, the date and time when the internal resistance (highest value) is calculated, and the running distance of the vehicle 100 when the internal resistance (highest value) is calculated can be transmitted to the server 200. The data and time and the running distance are stored in the database 201 together with the internal resistance (highest value) in correspondence with the identifying information of the assembled battery 10.

According to the present embodiment, the internal resistance having the highest value of the resistance values of the plurality of battery blocks 12 is used to determine the deterioration state of the assembled battery 10. In other words, the most deteriorated battery block 12 is used as the reference to determine the deterioration state of the assembled battery 10. If a battery block 12 different from the most deteriorated battery block 12 is used as the reference to determine the deterioration state of the assembled battery 10, the determination of whether or not the assembled battery 10 can be reused may be erroneously made. In the present embodiment, the use of the most deteriorated battery block 12 as the reference can prevent an erroneous determination of whether or not the assembled battery 10 can be reused or an erroneous estimation of the period in which the assembled battery 10 can be reused.

When the internal resistances vary among the plurality of battery blocks 12, the life of the assembled battery 10 is most affected by the battery block 12 having the highest internal resistance, that is, the most deteriorated battery block 12. Thus, the determination of the deterioration state of the assembled battery 10 based on the internal resistance (highest value) as in the present embodiment can prevent an erroneous determination of whether or not the assembled battery 10 can be reused as a whole.

The assembled battery 10 is an item to be reused in the present embodiment. An example of the structure of the assembled battery 10 includes the plurality of cells 11 arranged along one direction and a pair of end plates holding the plurality of cells 11 therebetween to apply a restraint force to the plurality of cells 11. The restraint force refers to a force with which the plurality of cells 11 are tightly held in the direction in which the plurality of cells 11 are arranged. The pair of end plates can be coupled through a restraint band, a restraint rod or the like to produce the restraint force. When the end plates are used to form the assembled battery 10, the assembled battery 10 can be reused without disassembly. This can facilitate replacement operation or the like of the assembled battery 10.

Alternatively, a plurality of cells 11 and a pair of endplates can constitute a single battery stack, and a plurality of such battery stacks can be used to constitute the assembled battery 10. The plurality of battery stacks can be placed along one direction and can be connected electrically in series or in parallel. In the assembled battery 10 formed in this manner, the assembled battery 10 can also be reused without disassembly, and the replacement operation or the like of the assembled battery 10 can be facilitated.

The assembled battery 10 to be reused can be used as the power source for the hybrid vehicle in the present embodiment. When the assembled battery 10 is used as the power source for the electric vehicle, it is generally preferable that the capacity deterioration of the assembled battery 10 (battery block 12 and cell 11) should be obtained in terms of ensuring the running distance of the vehicle.

On the other hand, in the hybrid vehicle, it may be more important to ensure the momentary output than to ensure the running distance of the vehicle. The momentary output of the assembled battery 10 may be required in response to operation of an accelerator pedal by a driver. To ensure the momentary output, it is preferable that the deterioration state of the input/output characteristics of the assembled battery 10 should be obtained. In other words, it is preferable that the internal resistance of the assembled battery 10 should be obtained. Since the deterioration state of the assembled battery 10 is determined on the basis of the internal resistance of the battery block 12 in the present embodiment, the assembled battery 10 to be reused can be preferably used as the power source for the hybrid vehicle.

Embodiment 2

Embodiment 2 of the present invention is now described. The present embodiment relates to a method of replacing some of cells 11 included in the assembled battery 10 with cells 11 to be reused. The members identical to those described in Embodiment 1 are designated with the same reference numerals, and detailed description thereof is omitted.

As described in FIG. 1, the assembled battery 10 has a plurality of battery blocks 12 connected electrically in series, and each of the battery blocks 12 can be replaced individually. Specifically, once at least one of the plurality of battery blocks 12 is deteriorated, that deteriorated battery block 12 can be replaced with a battery block 12 to be reused.

The battery block 12 to be reused refers to a used battery block 12 which can continue to be used in view of the deterioration state thereof. While the battery block 12 includes a plurality of cells 11 in the present embodiment, the battery block 12 may be formed of a single cell 11.

Figure 6:
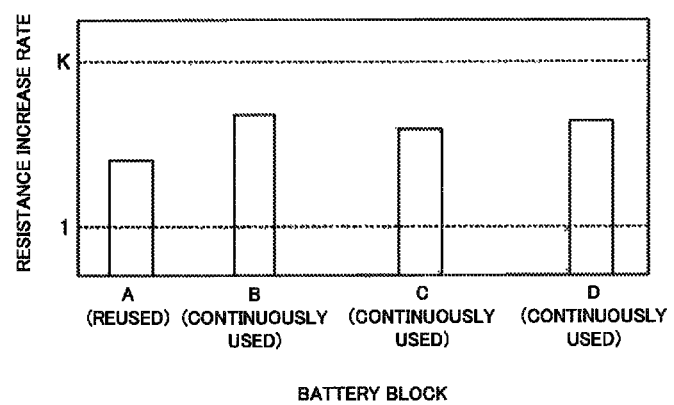
FIG. 6 is a graph showing the relationship between the resistance increase rate of a battery block to be reused and the resistance increase rates of battery blocks to be used continuously.

FIG. 6 shows the relationship between battery blocks 12 to be used continuously and a battery block 12 to be used after replacement. The battery block 12 to be used continuously refers to a battery block 12 which is not a subject of replacement. In FIG. 6, the vertical axis represents a resistance increase rate, and the horizontal axis represents the type of the battery block 12. A represents the battery block 12 to be reused, and B to D represent the battery blocks 12 to be used continuously.

The resistance increase rate is represented by the ratio (Rr/Rini) between the resistance value (Rini) of the battery block 12 in the initial state and the resistance value (Rr) of the battery block 12 in the deteriorated state. The initial state refers to a state serving as the reference used to determine the deterioration of the battery block 12, and is the state immediately after the battery block 12 is manufactured, for example. When the battery block 12 is in the initial state, the resistance increase rate is equal to one. As the battery block 12 is more deteriorated, the resistance increase rate is increased above one.

The resistance value of the battery block 12 can be calculated on the basis of the value of a voltage of the battery block 12 detected by the voltage sensor 21 and the value of a current detected by the current sensor 22. When the voltage of each of the cells 11 included in the battery block 12 can be detected, the resistance value of each cell 11 can be calculated on the basis of the voltage of each cell 11 and the value of a current passing through each cell 11. In this case, the highest of the resistance values of the plurality of cells 11 can be used as the resistance value of the battery block 12 to calculate the resistance increase rate of the battery block 12.

A threshold value K shown in FIG. 6 is the reference for determining whether or not the battery block 12 should be replaced. When the resistance increase rate of the battery block 12 is higher than the threshold value K, it is determined that the battery block 12 needs replacement. When the resistance increase rate of the battery block 12 is lower than the threshold value K, the battery block 12 can continue to be used. The threshold value K can be set as appropriate in accordance with the characteristics of the battery block 12 (cell 11).

In the example shown in FIG. 6, the assembled battery 10 is formed of four, A to D, battery blocks 12, and the A battery block 12 is replaced. FIG. 6 shows the state after the replacement of the battery block 12. The A battery block 12 represents the battery block 12 to be reused. The B to D battery blocks 12 are included previously in the assembled battery 10 and are deteriorated due to charge and discharge of the battery block 12 or the like. The resistance increase rates of the B to D battery blocks 12 may vary depending on variations in temperature environments or variations in input/output characteristics.

In the example shown in FIG. 6, the B battery block 12 has the highest resistance increase rate, and the C battery block 12 has the lowest resistance increase rate. The D battery block 12 has the resistance increase rate lower than the resistance increase rate of the B battery block 12 and higher than the resistance increase rate of the C battery block 12. Since the A battery block 12 is the battery block 12 to be reused, the A battery block 12 has the resistance increase rate higher than one.

The resistance increase rate of the A battery block 12 can be previously acquired before the replacement of the battery block 12. Specifically, before the A battery block 12 is incorporated into the assembled battery 10, the resistance value of the A battery block 12 can be measured to acquire the resistance increase rate of the A battery block 12.

After the incorporation of the A battery block 12, the resistance increase rates of the A to D battery blocks 12 are increased in accordance with the charge and discharge states of the assembled battery 10. For example, when the resistance increase rates of the A to D battery blocks 12 are increased by the same change amount, the resistance increase rate of the B battery block 12 reaches the threshold value K earliest.

In the present embodiment, the resistance increase rate of the A battery block 12 to be reused is set to be lower than the resistance increase rates of the B to D battery blocks 12 to be used continuously. In other words, the resistance increase rate of the A battery block 12 is set to be lower than the lowest (the resistance increase rate of the C battery block 12) of the resistance increase rates of the B to D battery blocks 12 to be used continuously. This can prevent the resistance increase rate of the A battery block 12 from reaching the threshold value K earlier than the B to D battery blocks 12, which can avoid an increase in the frequency of replacement of the A battery block 12.

If the resistance increase rate of the A battery block 12 is higher than the resistance increase rate of any of the B to D battery blocks 12, the resistance increase rate of the A battery block 12 reaches the threshold value K earlier than that of the B to D battery blocks 12, so that the A battery block 12 needs to be replaced. In addition, the state of the A battery block 12 may limit the input/output (charge and discharge) of the assembled battery 10. Especially, if the resistance increase rate of the A battery block 12 is higher than the resistance increase rates of all of the B to D battery blocks 12, the state of the A battery block 12 limits the input/output of the assembled battery 10.

For example, the input/output of the assembled battery 10 can be controlled by monitoring the voltages of the A to D battery blocks 12. Specifically, when the voltage of each battery block 12 is higher than the upper limit voltage, the input (charge) of the assembled battery 10 can be limited. When the voltage of each battery block 12 is lower than the lower limit voltage, the output (discharge) of the assembled battery 10 can be limited.

The upper limit voltage and the lower limit voltage are predefined values based on the characteristics of the battery block 12 in order to protect the battery block 12 from overcharge or overdischarge. When the input/output of the assembled battery 10 is limited, no input/output of the assembled battery 10 is performed or the electric power at which the input/output can be performed is reduced.

If the resistance increase rate of the A battery block 12 is higher than the resistance increase rates of the B to D battery blocks 12, the voltage of the A battery block 12 is likely to exceed the upper limit voltage earlier than the voltages of the B to D battery blocks 12, and the voltage of the A battery block 12 is likely to fall below the lower limit voltage earlier than the voltages of the B to D battery blocks 12. In this case, the inputs/outputs of the B to D battery blocks 12 are limited by the A battery block 12.

According to the present embodiment, the battery block 12 having the resistance increase rate lower than the resistance increase rates of the B to D battery blocks 12 is used as the A battery block 12 incorporated into the assembled battery 10, thereby making it possible to prevent the input/output of the assembled battery 10 from being limited by the replaced A battery block 12. Preferably, the resistance increase rate of the A battery block 12 to be replaced is lower than the lowest of the resistance increase rates of the B to D battery blocks 12 to be used continuously.

While the single battery block 12 is replaced in the example shown in FIG. 6, a plurality of battery blocks 12 may be replaced. In replacing the plurality of battery blocks 12, the resistance increase rate of each of the battery blocks 12 to be reused can also be set to be lower than the resistance increase rate of the battery block 12 to be used continuously. Preferably, the number of battery blocks 12 to be replaced is lower than the number of battery blocks 12 to be used continuously. When the number of battery blocks 12 to be replaced is larger than the number of battery blocks 12 to be used continuously, the entire assembled battery 10 is replaced preferably.

The A battery block 12 to be reused can be determined on the basis of the use history of the assembled battery 10. The use history is information representing changes in parameter which influences the deterioration of the assembled battery 10 (battery block 12). Examples of the parameter used in the use history include the temperature and the SOC (State Of Charge) of the assembled battery 10 (battery block 12). The SOC indicates the ratio of the current charge capacity to the full charge capacity.

When the assembled battery 10 is mounted on the vehicle, the information about the use history can be acquired in the vehicle and stored in a memory mounted on the vehicle. As shown in FIG. 4 and FIG. 5, the information about the use history can be transmitted from the vehicle 100 (radio communication device 101) to the server 200 and stored in the database 201. Once the information about the use history is stored in the database 201, the radio communication device 101 can acquire the information about the use history from the server 200. In addition, a terminal such as a PC (Personal Computer) can be used to access the server 200 to acquire the information about the use history.

Figure 7A:
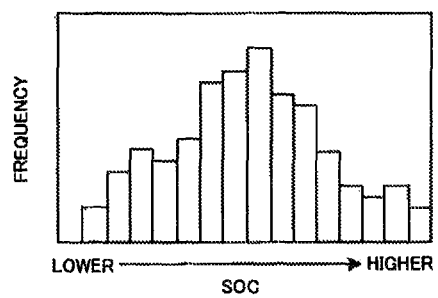
FIG. 7A is a graph showing an SOC distribution.
Figure 7B:
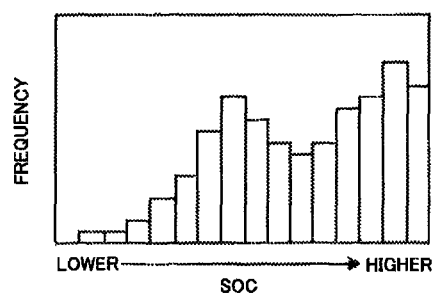
FIG. 7B is a graph showing an SOC distribution.

FIG. 7A and FIG. 7B each show a distribution of the SOC of the assembled battery 10 as an example of the use history. In FIG. 7A and FIG. 7B, the vertical axis represents the frequency and the horizontal axis represents the segments of the SOC of the assembled battery 10. For example, the segments of the SOC can be set by dividing the range of the SOC from 0% to 100% in steps of a predetermined change amount.

While the SOC of the assembled battery 10 is acquired in FIG. 7A and FIG. 7B, the SOC of the battery block 12 may be acquired. When the plurality of battery blocks 12 have different SOCs, the SOC having the highest value or the lowest value can be monitored to acquire the SOC distribution similar to those in FIG. 7A and FIG. 7B, for example.

The range of the SOC for the division is not limited to the range from 0% to 100%, and for example, the range of the SOC used in charge and discharge control of the assembled battery 10 can be used. In changing the SOC of the assembled battery 10 between the lower limit SOC and the upper limit SOC through the charge and discharge control of the assembled battery 10, the range between the lower limit SOC and the upper limit SOC can be set to the range of the SOC for the division. The lower limit SOC and the upper limit SOC can be previously set.

The SOC distributions shown in FIG. 7A and FIG. 7B can be acquired with a method described below.

The controller 30 shown in FIG. 1 can calculate (estimate) the SOC of the assembled battery 10 at predetermined intervals. When the assembled battery 10 is mounted on the vehicle, the controller 30 can calculate the SOC of the assembled battery 10 at the predetermined intervals while an ignition switch of the vehicle is ON. For example, the controller 30 can totalize charge and discharge currents of the assembled battery 10 based on the output from the current sensor 22 to calculate the SOC of the assembled battery 10.

Alternatively, the controller 30 can acquire the voltage of the assembled battery 10 based on the output from the voltage sensor 21 and calculate the SOC of the assembled battery 10 from the voltage of the assembled battery 10. When the voltage of the assembled battery 10 is previously associated with the SOC of the assembled battery 10, the SOC of the assembled battery 10 can be calculated from the voltage of the assembled battery 10. Since each of the voltage sensors 21 detects the voltage of each of the battery blocks 12 in the configuration shown in FIG. 1, the controller 30 can sum the voltage values acquired from the plurality of voltage sensors 21 to acquire the voltage of the assembled battery 10.

Since the SOC is divided into the plurality of segments, the controller 30 can determine which SOC segment the calculated SOC of the assembled battery 10 belongs to. When the calculated SOC belongs to a specific one of the SOC segments, the controller 30 increments a counter associated with the specific SOC segment. The counter is provided for each of the plurality of SOC segments.

The increment of the counter associated with each SOC segment can result in the SOC distribution as shown in FIG. 7A and FIG. 7B. As the value of the counter is increased, the frequency shown in FIG. 7A and FIG. 7B becomes higher.

A comparison between FIG. 7A and FIG. 7B shows that the SOC distribution in FIG. 7B is shifted toward a higher SOC. In other words, in the state shown in FIG. 7B, the SOC of the assembled battery 10 is held higher as compared with the state shown in FIG. 7A. As the SOC of the assembled battery 10 is held higher, the resistance increase rate of the assembled battery 10 (battery block 12) is increased more easily. Thus, the assembled battery 10 used in the use environment of FIG. 7B tends to be deteriorated more easily than the assembled battery 10 used in the use environment of FIG. 7A.

Figure 8:
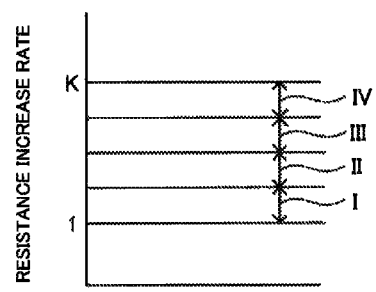
FIG. 8 is a diagram for explaining how to place battery blocks to be reused in ranks.

When the resistance increase rates of the battery blocks 12 to be reused are divided into a plurality of ranks, the battery block 12 belonging to one of the ranks suitable for the use state of the assembled battery 10 can be used as the battery block 12 to be replaced. As shown in FIG. 8, the ranks can be previously defined in accordance with the values of the resistance increase rate.

In FIG. 8, ranks I to IV are set in accordance with the resistance increase rate and indicate different ranges of the resistance increase rates. The ranks I to IV are defined within the range of the resistance increase rates from 1 to threshold value K. The resistance increase rate is increased and the rank of the battery block 12 is reduced in the order of I, II, III, and IV. While FIG. 8 shows the division into the four ranks I to IV, the number of the ranks may be set as appropriate.

When the SOC distributions are previously associated with the ranks of the resistance increase rates, the rank of the resistance increase rate can be determined from the SOC distribution. Once the rank of the resistance increase rate is determined, the battery block 12 belonging to the determined rank can be used as the battery block 12 to be replaced.

In the correspondence between the SOC distribution and the rank of the resistance increase rate, a higher rank of the resistance increase rate can be used as the SOC distribution is shifted to a higher SOC. In other words, as the SOC distribution is shifted to a higher SOC, the battery block 12 with a lower resistance increase rate can be selected as the battery block 12 to be incorporated into the assembled battery 10. In establishing the correspondence between the SOC distribution and the rank of the resistance increase rate, the peak value of the SOC distribution can be associated with the rank of the resistance increase rate, or the average value of the SOC distribution can be associated with the rank of the resistance increase rate, for example.

For example, in the SOC distribution shown in FIG. 7B, the battery block 12 in the rank I can be used as the A battery block 12. In the SOC distribution shown in FIG. 7A, the battery block 12 in the rank II can be used as the A battery block 12.

In the SOC distribution shown in FIG. 7B, the resistance increase rates of the A to D battery blocks 12 are increased easily. The use of the battery block 12 in the rank I as the A battery block 12 prevents the resistance increase rate of the A battery block 12 from immediately reaching the threshold value K. This can suppress an increase in the frequency of replacement of the A battery block 12.

In the SOC distribution shown in FIG. 7A, the resistance increase rates of the A to D battery blocks 12 are increased less easily as compared with the SOC distribution shown in FIG. 7B. Even when the battery block 12 in the rank II lower than the rank I is used as the A battery block 12, the resistance increase rate of the A battery block 12 does not reach the threshold value K immediately.

Since the battery blocks 12 in the ranks I to IV are used individually as appropriate for the SOC distribution, the battery blocks 12 in the rank I to IV can be efficiently used. The battery blocks 12 to be reused are classified into the ranks I to IV based on the deterioration state, so that all of the ranks I to IV may include one or more battery blocks 12. One of the ranks I to IV can be selected in association with the SOC distribution to use the battery blocks 12 in the ranks I to IV without waste.

Figure 9A:
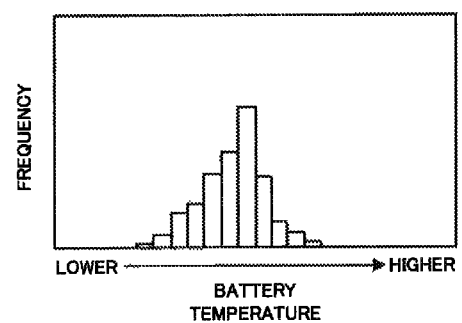
FIG. 9A is a graph showing a battery temperature distribution.
Figure 9B:
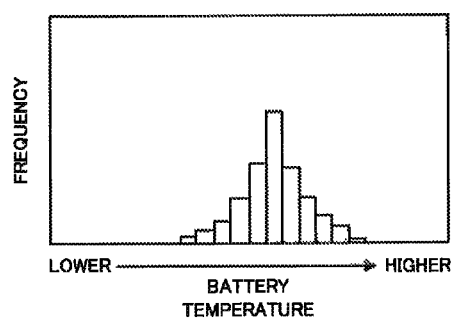
FIG. 9B is a graph showing a battery temperature distribution.

FIG. 9A and FIG. 9B each show a distribution of temperature of the assembled battery 10 as an example of the use history. In FIG. 9A and FIG. 9B, the vertical axis represents the frequency and the horizontal axis represents the segments of the temperature of the assembled battery 10. For example, the segments of the temperature can be set by dividing a predetermined temperature range in steps of a predetermined change amount. The predetermined temperature range can be temperatures which the assembled battery 10 can have, for example.

The temperature of the assembled battery 10 can be acquired by using a temperature sensor. Specifically, the controller 30 shown in FIG. 1 can acquire the temperature of the assembled battery 10 based on the output from the temperature sensor.

Since the temperature of the assembled battery 10 is divided into the plurality of segments, the controller 30 can determine which temperature segment the temperature acquired from the temperature sensor belongs to. When the acquired temperature belongs to a specific one of the temperature segments, the controller 30 increments a counter associated with the specific temperature segment. The counter is provided for each of the plurality of temperature segments. The increment of the counter associated with each temperature segment can result in the temperature distribution as shown in FIG. 9A and FIG. 9B. As the value of the counter is increased, the frequency shown in FIG. 9A and FIG. 9B becomes higher.

For acquiring the temperature distributions shown in FIG. 9A and FIG. 9B, the temperature of the assembled battery 10 can be monitored for a predetermined time, and when the temperature changes during the predetermined time, it can be determined which temperature segment the temperature corresponding to the highest value belongs to, for example. When the temperature does not change during the predetermined time, it can be determined which temperature segment the temperature belongs to. Alternatively, the temperature of the assembled battery 10 can be detected at predetermined intervals, and it can be determined which temperature segment the detected temperature belongs to.

A comparison between FIG. 9A and FIG. 9B shows that the temperature distribution in FIG. 9B is shifted toward a higher temperature. In other words, in the state shown in FIG. 9B, the temperature of the assembled battery 10 is held higher as compared with the state shown in FIG. 9A. As the temperature of the assembled battery 10 is held higher, the resistance increase rate of the assembled battery 10 (battery block 12) is increased more easily. Thus, the assembled battery 10 used in the use environment of FIG. 9B tends to be deteriorated more easily than the assembled battery 10 used in the use environment of FIG. 9A.

When the resistance increase rates of the battery blocks 12 to be reused are divided into a plurality of ranks as described in FIG. 8, the battery block 12 belonging to one of the ranks suitable for the use state of the assembled battery 10 can be used as the battery block 12 to be incorporated into the assembled battery 10. When the temperature distributions are previously associated with the ranks of the resistance increase rate, the rank of the resistance increase rate can be determined from the temperature distribution. Once the rank of the resistance increase rate is determined, the battery block 12 belonging to the determined rank can be used as the battery block 12 to be incorporated into the assembled battery 10.

In the correspondence between the temperature distribution and the rank of the resistance increase rate, a higher rank of the resistance increase rate can be used as the temperature distribution is shifted to a higher temperature. In other words, as the temperature distribution is shifted to a higher temperature, the battery block 12 with a lower resistance increase rate can be selected as the battery block 12 to be incorporated into the assembled battery 10. In establishing the correspondence between the temperature distribution and the rank of the resistance increase rate, the peak value of the temperature distribution can be associated with the rank of the resistance increase rate, or the average value of the temperature distribution can be associated with the rank of the resistance increase rate, for example.

For example, in the temperature distribution shown in FIG. 9B, the battery block 12 in the rank I can be used as the A battery block 12. In the temperature distribution shown in FIG. 9A, the battery block 12 in the rank II can be used as the A battery block 12.

In the temperature distribution shown in FIG. 9B, the resistance increase rates of the A to D battery blocks 12 are increased easily. The use of the battery block 12 in the rank I as the A battery block 12 prevents the resistance increase rate of the A battery block 12 from immediately reaching the threshold value K. This can suppress an increase in the frequency of replacement of the A battery block 12.

In the temperature distribution shown in FIG. 9A, the resistance increase rates of the A to D battery blocks 12 are increased less easily as compared with the temperature distribution shown in FIG. 9B. Even when the battery block 12 in the rank II lower than the rank I is used as the A battery block 12, the resistance increase rate of the A battery block 12 does not reach the threshold value K immediately.

Figure 10A:
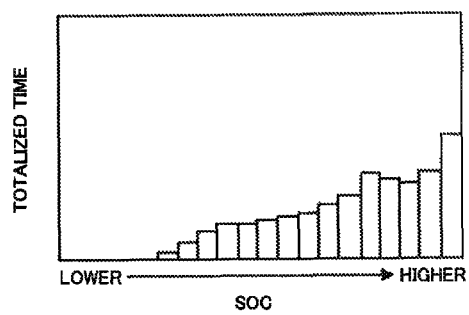
FIG. 10A is a graph showing a totalized time distribution in SOC segments.
Figure 10B:
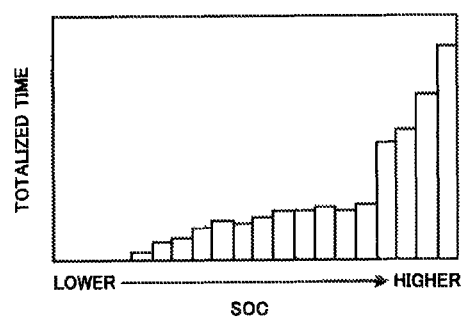
FIG. 10B is a graph showing a totalized time distribution in SOC segments.

FIG. 10A and FIG. 10B each show a distribution of totalized time for each SOC of the assembled battery 10 as an example of the use history. In FIG. 10A and FIG. 10B, the vertical axis represents the totalized time and the horizontal axis represents the segments of the SOC of the assembled battery 10. The totalized time refers to a time period for which the SOC included in each SOC segment is maintained when charge and discharge of the assembled battery 10 is not performed. For the assembled battery 10 mounted on the vehicle, the totalized time may be a time period for which the SOC included in each SOC segment is maintained when the ignition switch of the vehicle is OFF, for example.

As described in FIG. 7A and FIG. 7B, the segments of the SOC can be set by dividing a predetermined range of the SOC in steps of a predetermined change amount, for example. The predetermined SOC range can be set as appropriate as described in FIG. 7A and FIG. 7B.

The controller 30 calculates (estimates) the SOC of the assembled battery 10 upon stop of charge and discharge of the assembled battery 10. When the assembled battery 10 is mounted on the vehicle, the controller 30 calculates the SOC of the assembled battery 10 upon switching of the ignition switch from ON to OFF. Information about the ON and OFF of the ignition switch is input to the controller 30.

The controller 30 can determine which SOC segment the calculated SOC belongs to. The controller 30 uses a timer to measure the time period for which the charge and discharge of the assembled battery 10 is stopped.

When the charge and discharge is stopped again after the start of the charge and discharge of the assembled battery 10, the controller 30 calculates the SOC of the assembled battery 10 and measures the time period for which the charge and discharge is stopped. When the SOCs calculated at different points in time belong to the same SOC segment, the controller 30 totalizes the measured time periods. This can provide the totalized time associated with each SOC segment as shown in FIG. 10A and FIG. 10B.

A comparison between FIG. 10A and FIG. 10B shows that the totalized time distribution in FIG. 10B is shifted toward a higher SOC. In other words, in the state shown in FIG. 10B, the SOC of the assembled battery 10 is held higher as compared with the state shown in FIG. 10A. As the SOC of the assembled battery 10 is held higher, the resistance increase rate of the assembled battery 10 (battery block 12) is increased more easily. Thus, the assembled battery 10 used in the use environment of FIG. 10B tends to be deteriorated more easily than the assembled battery 10 used in the use environment of FIG. 10A.

When the resistance increase rates of the battery blocks 12 to be reused are classified into a plurality of ranks as described in FIG. 8, the battery block 12 belonging to one of the ranks suitable for the use state of the assembled battery 10 can be used as the battery block 12 to be incorporated into the assembled battery 10. When the totalized time distributions are previously associated with the ranks of the resistance increase rate, the rank of the resistance increase rate can be determined from the totalized time distribution. Once the rank of the resistance increase rate is determined, the battery block 12 belonging to the determined rank can be used as the battery block 12 to be incorporated into the assembled battery 10.

In the correspondence between the totalized time distribution and the rank of the resistance increase rate, a higher rank of the resistance increase rate can be used as the totalized time distribution is shifted to a higher SOC. In other words, as the totalized time distribution is shifted to a higher SOC, the battery block 12 with a lower resistance increase rate can be used. In establishing the correspondence between the totalized time distribution and the rank of the resistance increase rate, the peak value of the totalized time distribution can be associated with the rank of the resistance increase rate, or the average value of the totalized time distribution can be associated with the rank of the resistance increase rate, for example.

For example, in the totalized time distribution shown in FIG. 10B, the battery block 12 in the rank I can be used as the A battery block 12. In the totalized time distribution shown in FIG. 10A, the battery block 12 in the rank II can be used as the A battery block 12.

In the totalized time distribution shown in FIG. 10B, the resistance increase rates of the A to D battery blocks 12 are increased easily. The use of the battery block 12 in the rank I as the A battery block 12 prevents the resistance increase rate of the A battery block 12 from immediately reaching the threshold value K. This can suppress an increase in the frequency of replacement of the A battery block 12.

In the totalized time distribution shown in FIG. 10A, the resistance increase rates of the A to D battery blocks 12 are increased less easily as compared with the totalized time distribution shown in FIG. 10B. Even when the battery block 12 in the rank II lower than the rank I is used as the A battery block 12, the resistance increase rate of the A battery block 12 does not reach the threshold value K immediately.

Figure 11:
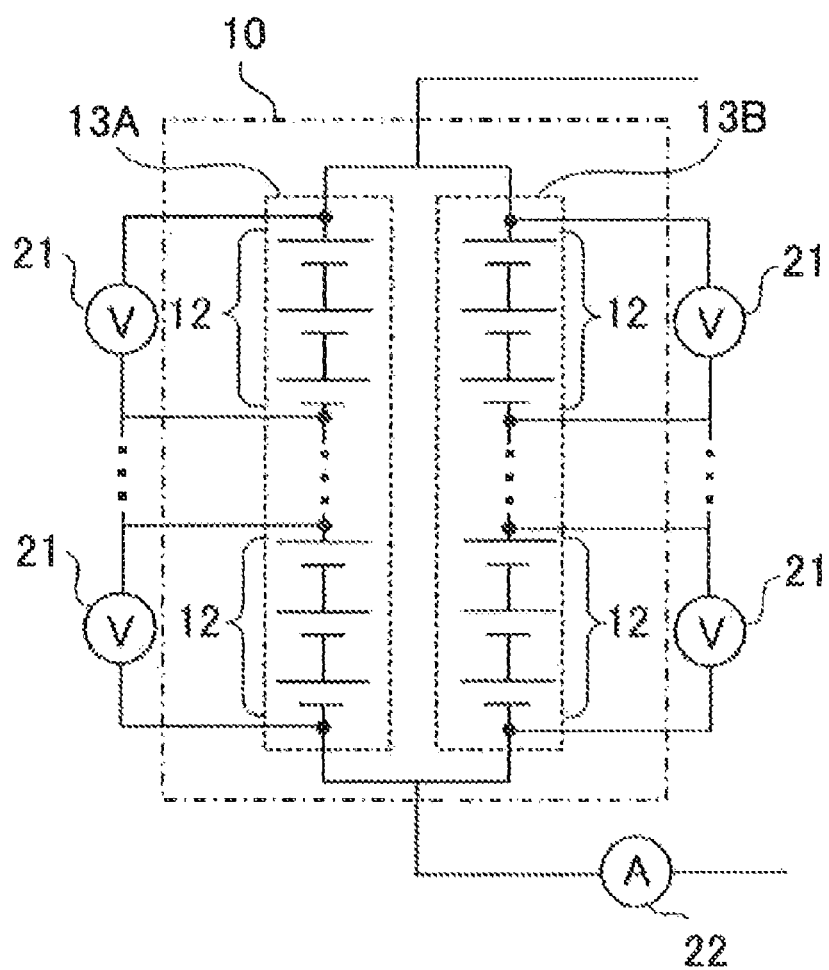
FIG. 11 is a diagram showing the configuration of an assembled battery which is a modification.

While the plurality of battery blocks 12 are connected electrically in series in the assembled battery 10 in the present embodiment, the present invention is not limited thereto. Specifically, as shown in FIG. 11, a plurality of battery blocks 12 connected electrically in parallel may be included in the assembled battery 10. In FIG. 11, the assembled battery 10 has a first battery group 13A and a second battery group 13B connected electrically in parallel.

The first battery group 13A includes a plurality of battery blocks 12 connected electrically in series. The second battery group 13B includes a plurality of battery blocks 12 connected electrically in series.

In a battery system shown in FIG. 11, the battery block 12 can be replaced in each of the first battery group 13A and the second battery group 13B as described in the present embodiment. Specifically, in replacing the battery block 12 included in the first battery group 13A or the second battery group 13B with a battery block 12 to be reused, the resistance increase rate of the battery block 12 to be reused can be set to be lower than the resistance increase rate of the battery block 12 to be used continuously. For example, in replacing the battery block 12 included in the first battery group 13A, the resistance increase rate of the battery block 12 to be reused can be set to be lower than the resistance increase rate of the battery block 12 to be used continuously in the first battery group 13A.

When a plurality of battery blocks 12 should be used continuously, the resistance increase rate of the battery block 12 to be reused is preferably lower than the lowest of the resistance increase rates of the plurality of battery blocks 12 to be used continuously. In replacing the battery block 12 included in the first battery group 13A, the resistance increase rate of the battery block 12 to be reused may not be lower than the resistance increase rates of the battery blocks 12 included in the second battery group 13B.

When the first battery group 13A and the second battery group 13B are connected electrically in parallel, not only charge and discharge of both the battery groups 13A and 13B but also charge and discharge of only one of the battery groups 13A and 13B can be performed. Thus, in replacing the battery block 12, it is only required that the resistance increase rates in each of the battery groups 13A and 13B should have the relationship described in the present embodiment.

While the history of the temperature and the SOC of the assembled battery 10 are employed as the use history of the assembled battery 10 in the above description, the present invention is not limited thereto. For example, when the assembled battery 10 is mounted on the vehicle, the running distance of the vehicle can be used as the use history of the assembled battery 10.

The relationship between the running distance of the vehicle and the resistance increase rate of the battery block 12 is previously determined in the previously assumed use state of the assembled battery 10. The running distance of the vehicle is acquired, and when the actual resistance increase rate of the battery block 12 is higher than the resistance increase rate associated with that running distance, it can be seen that the deterioration of the battery block 12 is proceeding at a high rate. In this case, the battery block 12 can be replaced by using the battery block 12 in a higher rank, that is, the battery block 12 having a lower resistance increase rate, as the battery block 12 to be reused. This can suppress an increase in the frequency of replacement of the battery block 12 to be reused.

Alternatively, when the actual resistance increase rate of the battery block 12 is lower than the resistance increase rate associated with the running distance of the vehicle at the acquisition of the running distance, it can be seen that the deterioration of the battery block 12 is proceeding at a low rate. In this case, the battery block 12 can be replaced by using the battery block 12 in a lower rank, that is, the battery block 12 having a higher resistance increase rate, as the battery block 12 to be reused.

Charge and discharge currents of the assembled battery 10 can be used as the use history of the assembled battery 10. As the current value in charge and discharge of the assembled battery 10 is increased, the battery block 12 may be deteriorated more easily. Specifically, when the assembled battery 10 is charged and discharged at a high rate, the ion concentration may be nonuniform in a positive electrode or a negative electrode to increase the resistance increase rate of the battery block 12.

Thus, when the charge and discharge are performed at a high rate, the battery block 12 in a higher rank can be used as the battery block 12 to be reused. When the charge and discharge are not performed at a high rate, the resistance increase rate of the battery block 12 is not increased easily, so that the battery block 12 in a lower rank can be used as the battery block 12 to be reused.

The voltage of the battery block 12 can be used as the use history of the assembled battery 10. The charge and discharge of the assembled battery 10 are controlled such that the voltage of the battery block 12 is changed between the upper limit voltage and the lower limit voltage. When the voltage of the battery block 12 stays at the upper limit voltage or the lower limit voltage, the battery block 12 may be easily deteriorated.

The rank of the battery block 12 to be reused can be determined on the basis of the time period (totalized time) for which the voltage of the battery block 12 stays at the upper limit voltage or the lower limit voltage. Specifically, as the time period for which the voltage of the battery block 12 stays at the upper limit voltage or the lower limit voltage is longer, the battery block 12 in a higher rank can be used as the battery block 12 to be reused. As the time period for which the voltage of the battery block 12 stays at the upper limit voltage or the lower limit voltage is shorter, the battery block 12 in a lower rank can be used as the battery block 12 to be reused.

The full charge capacity of the battery block 12 is changed in accordance with the use state of the assembled battery 10. A lower full charge capacity means that the battery block 12 is more deteriorated. As the battery block 12 to be used continuously has a lower full charge capacity, the battery block 12 in a higher rank can be used as the battery block 12 to be reused. This can suppress an increase in the frequency of replacement of the battery block 12 to be reused as in the present embodiment.

The full charge capacity of the battery block 12 to be used continuously can be calculated by charging or discharging the battery block 12 at a constant current. An example of the method of measuring the full charge capacity involves measuring a voltage V0 immediately before the start of charge of the battery block 12 and measuring a voltage V1 when the charge of the battery block 12 is finished to eliminate any polarized component. In addition, a current during the charge of the battery block 12 is measured to calculate a current total value $\Sigma I0$. Next, a previously determined OCV curve of the battery is used to determine a change amount $\Delta SOC$ of the SOC during the charge from the voltage V0 to the voltage V1. The current total value $\Sigma I0$ can be divided by the change amount $\Delta SOC$ to determine the full charge capacity (Ah). The calculation of the full charge capacity can be performed in replacing the battery block 12.

When a comparison between the assembled batteries 10 including the battery blocks 12 to be used continuously having substantially the same full charge capacity shows that one of the assembled batteries 10 has the SOC distribution shifted toward a lower SOC, that is, corresponds to that shown in FIG. 7A of those shown in FIG. 7A and FIG. 7B, then the battery block 12 in a lower rank can be used for that assembled battery 10. When a comparison between the assembled batteries 10 including the battery blocks 12 to be used continuously having substantially the same full charge capacity shows that one of the assembled batteries 10 has the temperature distribution shifted toward a lower temperature, that is, corresponds to that shown in FIG. 9A of those shown in FIG. 9A and FIG. 9B, then the battery block 12 in a lower rank can be used for that assembled battery 10.

For the totalized time distribution, the battery block 12 in a lower rank can be used in the assembled battery 10 having the totalized times at lower SOCs longer than the totalized times at higher SOCs, that is, in the assembled battery 10 corresponding to that shown in FIG. 10A of those shown in FIG. 10A and FIG. 10B. The battery block 12 in a lower rank is, in other words, the battery block 12 having a higher resistance increase rate.

The invention claimed is:

1. An electric storage apparatus comprising:
   a plurality of lithium-ion batteries connected electrically in series, the plurality of lithium-ion batteries being divided into a plurality of blocks, the plurality of blocks including:
   a first block having at least one lithium ion-battery which is replaced by a reusable lithium-ion battery, wherein the reusable lithium-ion battery is an old and used lithium-ion battery, and
   a second block having at least one lithium-ion battery which is configured to be used continuously without being a subject of replacement,
   wherein the first block has a resistance increase rate lower than a resistance increase rate of the second block, in a state immediately after the reusable lithium-ion battery is incorporated in the first block, and the resistance increase rate of each of the first block and the second block is larger than 1.

2. The electric storage apparatus according to claim 1, wherein the first block has a smaller number of blocks than the second block.

3. The electric storage apparatus according to claim 1, wherein the electric storage apparatus comprises a plurality of second blocks, and
   the first block has the resistance increase rate lower than a lowest of resistance increase rates of the plurality of second blocks.

4. The electric storage apparatus according to claim 1, wherein the first block has the resistance increase rate associated with a use history of the electric storage apparatus before the first block is replaced.

5. The electric storage apparatus according to claim 4, wherein the use history is a history of a parameter contributing to deterioration of the lithium-ion battery.

6. The electric storage apparatus according to claim 4, wherein the use history is a frequency of occurrence of each SOC of the electric storage apparatus, a frequency of occurrence of each temperature of the electric storage apparatus, or a totalized time of each SOC when the SOC of the electric storage apparatus is maintained.

7. The electric storage apparatus according to claim 1, wherein each of the blocks has more than one of the lithium-ion batteries.

8. The electric storage apparatus according to claim 1, wherein first block corresponds to each of the lithium-ion batteries.

9. The electric storage apparatus according to claim 1, wherein the plurality of lithium-ion batteries are mounted on a vehicle and output an energy for use in running of the vehicle.

\* \* \* \* \*